United States Patent [19]
Kojima et al.

[11] Patent Number: 5,371,406
[45] Date of Patent: Dec. 6, 1994

[54] SEMICONDUCTOR DEVICE

[75] Inventors: Shinjiro Kojima, Chigasaki; Seiichi Hirata, Yokosuka, both of Japan

[73] Assignee: Kabushiki Kaisha Toshiba, Kawasaki, Japan

[21] Appl. No.: 97,026

[22] Filed: Jul. 27, 1993

[30] Foreign Application Priority Data

Dec. 16, 1992 [JP] Japan ................................. 4-336044

[51] Int. Cl.⁵ ..................... H01L 23/48; H01L 29/46; H01L 29/62; H01L 29/64
[52] U.S. Cl. ................................ 257/672; 257/666; 257/675; 257/687; 257/787
[58] Field of Search ............... 257/666, 675, 668, 669, 257/787, 672

[56] References Cited

U.S. PATENT DOCUMENTS

| | | |
|---|---|---|
| 3,902,148 | 8/1975 | Drees et al. |
| 4,951,120 | 8/1990 | Hagiwara et al. |
| 5,065,504 | 1/1991 | Olla .................... 257/669 |
| 5,191,403 | 3/1993 | Nakazawa ............. 257/787 |
| 5,210,440 | 5/1993 | Long .................... 257/675 |

FOREIGN PATENT DOCUMENTS

| | | |
|---|---|---|
| 0498446 | 8/1992 | European Pat. Off. ......... 257/668 |
| 4113034 | 2/1992 | Germany . |

OTHER PUBLICATIONS

IEEE Transactions of Components, Hybrids & Manufacturing Technology, vol. CHMT-10, No. 3, Sep. 1987, Steven T. Holzinger, et al., "Advantages of a Floating Annular Ring in Three-Layer Tab Assembly", pp. 332–334.

Feinwerktechnik & Messtechnik, vol. 100, No. 11, Nov. 1992, A Modl, pp. 506–510, "Die Verarbeitung von Fine-Pitch—Bauteilen mit Tape Automated Bonding (TAB)".

*Primary Examiner*—Andrew J. James
*Assistant Examiner*—S. V. Clark
*Attorney, Agent, or Firm*—Oblon, Spivak, McClelland, Maier & Neustadt

[57] ABSTRACT

According to this invention, there is provided a semiconductor device including a TAB tape having through hole for an element, a plurality of leads integrally formed on the TAB tape, a semiconductor element connected to one end of each of the leads through a bump formed in the through hole for the element, a plurality of lead frames each connected to the other end of a corresponding one of the leads, and a mold resin sealed to cover the most part of the TAB tape, the leads, the semiconductor element, and the lead frames, wherein connection portions between the leads and the lead frames are linearly formed at equal pitches perpendicularly to an outer periphery of the semiconductor element opposite to the connection portions. Each of portions near positions where the leads are respectively connected to the lead frames is formed in a gull-wing shape. The straight end portions of the lead frames extend from ends of the lead frames to flexing points of the lead frames, and the lengths of the straight end portions are set at least 0.3 mm or more. In the mold resin, the thickness of a resin positioned at the upper portion of the semiconductor element is set to be smaller than that of a resin positioned at the lower portion of the semiconductor element.

1 Claim, 4 Drawing Sheets

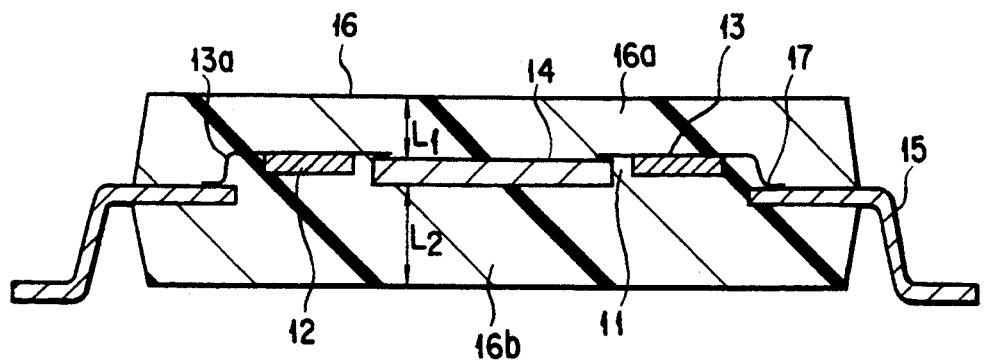
F I G. 4
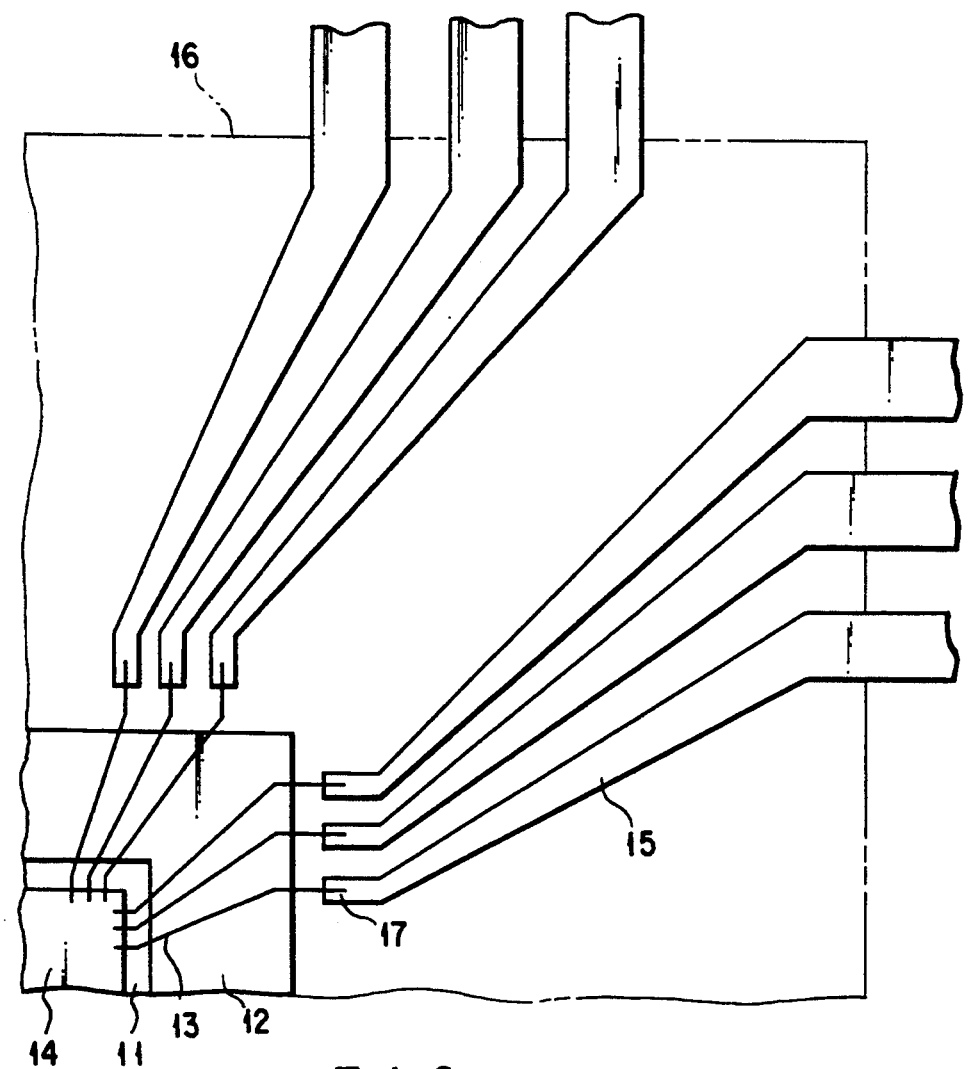
F I G. 5

SEMICONDUCTOR DEVICE

BACKGROUND OF THE INVENTION

1. Field of the Invention

The present invention relates to a TAB (Tape Automated Bonding) type semiconductor device and, more particularly, to an improvement of connection portions between leads and lead frames of the semiconductor device.

2. Description of the Related Art

In a conventional TAB type semiconductor device, as expressed by its name, a semiconductor element is arranged on a tape (film), and a bonding operation can be performed by an automatic machine. It is expected that TAB type semiconductor devices will be popularly used due to their flexibility or the like.

That is, a conventional TAB type semiconductor device is arranged as shown in FIGS. 1 to 3. FIG. 1 is a sectional view showing a schematic overall arrangement of the semiconductor device, FIG. 2 is an enlarged plan view showing a ¼ part of the device in FIG. 1, and FIG. 3 is an enlarged plan view showing a main part of the device in FIG. 2. As shown in FIG. 1, a conventional semiconductor device is constituted by a TAB tape 2 having an element through hole 1 and consisting of an insulator, a plurality of leads 3 consisting of a metal foil integrally formed on the TAB tape 2, a semiconductor element 4 arranged in the element through hole 1 and connected to one end of each of the leads 3 through a bump (not shown), a plurality of lead frames 5 each connected to the other end of a corresponding one of the leads 3, and a mold resin 6 sealed to cover the most part of the TAB tape 2, the leads 3, the semiconductor element 4, and the lead frames 5. Note that, in the mold resin 6, a resin positioned at the upper portion of the semiconductor element 4 and a resin positioned at the lower portion of the semiconductor element 4 have the same thickness L.

When the above semiconductor device is to be manufactured, one end of each of the leads 3 of the TAB tape 2 is connected to the semiconductor element 4 first. The semiconductor element 4 generally has Au bumps, and the leads 3 are Sn-plated. The leads 3 are heated by a bonding jig to form an Au—Sn alloy, thereby connecting the leads 3 to the semiconductor element 4. Each of the leads 3 of the TAB tape 2 is molded in a gull-wing shape, and cut to have a desired length. The leads 3 are laid on the lead frames 5, respectively and the positions of the leads 3 are respectively matched with the positions of the lead frames 5 such that the leads 3 overlap the lead frames 5. The lead frames 5 are generally Ag-plated, and the leads 3 are Sn-plated as described above. For this reason, when a bonding jig of about 550° C.×1″ is pressed on the leads 3 and the lead frames 5, Ag—Sn diffusion progresses to respectively connect the leads 3 to the lead frames 5. When the resultant structure in this state is arranged in a transfer mold, and is subjected to transfer molding, the conventional semiconductor device is completed.

The lead frames 5 are arranged in a radial form to their distal ends, and the lead frames 5 overlap the leads 3 of the TAB tape 2 at the connection portions 7 to be connected to the leads 3, respectively. In this case, as shown in FIG. 3, the pitches of the lead frames 5 are drawn such that the lead width h of each of the lead frames 5 and each lead interval h′ between the lead frames 5 assure a minimum width (0.22 or 0.27) at which etching or press processing can be performed, and a, b, c, d . . . are sequentially determined thereby setting the shape and size of each lead. Therefore, pitches between the leads satisfy a condition of $P_1' > P_2' > \ldots P_n'$. In accordance with this, the sizes of the leads 3 of the TAB tape 2 are determined accordingly.

In the conventional semiconductor device, however, the following drawback is posed. That is, the leads 3 of the TAB tape 2 are formed in a gull-wing shape, the pitches of the leads 3 are increased as the leads 3 become closer to the four corners of the semiconductor element 4, and the leads 3 are twisted and are not easily matched with the lead frames 5. In addition, the sizes of the pitches of the lead frames 5 and the sizes of the pitches of the leads 3 of the TAB tape 2 cannot easily be measured and managed because these pitches are not equal to each other. The lengths of the leads 3 of the TAB tape 2 tend to increase as the leads 3 become closer to the four corners of the semiconductor element 4. The leads 3 which are not formed in a gull-wing shape are used because the leads 3 of the TAB tape 2 cannot be stably formed in a gull-wing shape. For this reason, the thickness of the mold resin 6 at the upper portion of the semiconductor element 4 is increased, and passivation cracks disadvantageously occur.

SUMMARY OF THE INVENTION

It is an object of the present invention to provide a semiconductor device in which the pitches of the leads of a TAB tape are made uniform in order to facilitate size management of the TAB tape, and which prevents generation of passivation cracks in the semiconductor device, which is caused by stress of a mold resin.

According to the present invention, there is provided a semiconductor device comprising a TAB tape having through hole for an element, a plurality of leads integrally formed on the TAB tape, a semiconductor element connected to one end of each of the leads through a bump formed in the through hole for the element, a plurality of lead frames each connected to the other end of a corresponding one of the leads, and a mold resin sealed to cover most of the area of the TAB tape, the leads, the semiconductor element, and the lead frames, wherein connection portions between the leads and the lead frames are linearly formed at equal pitches perpendicularly to an outer periphery of the semiconductor element opposite to the connection portions.

Each of portions near positions where the leads are respectively connected to straight end portions of the lead frames is formed in a gull-wing shape. The straight end portions of the lead frames extend from ends of the lead frames to flexing points of the lead frames, and the lengths of the end portions are at least 0.3 mm or more. In the mold resin, the thickness of a resin positioned at the upper portion of the semiconductor element is set to be smaller than that of a resin positioned at the lower portion of the semiconductor element.

Therefore, according to the present invention, the size of the gull-wing shape of each of the leads of the TAB tape can easily be assured. Design, size measurement, and size management can easily be performed because the pitches of the lead frames are equal to each other, and because the pitches of the leads of the TAB tape on the lead frame side are equal to each other. In addition, cost required for manufacturing a mold and an etching pattern to be processed can be reduced by 15%. The size of the gull-wing shape of each of the leads of the TAB tape is set to be a desired size, thereby preventing passivation cracks occurring due to a stress of the mold resin.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4 is a sectional view showing an overall schematic arrangement of a TAB semiconductor device according to an embodiment of the present invention;

FIG. 5 is an enlarged plan view showing a main part of the semiconductor device in FIG. 4;

DETAILED DESCRIPTION OF THE PREFERRED EMBODIMENT

An embodiment of the present invention will be described below with reference to the accompanying drawings.

Figure 1:
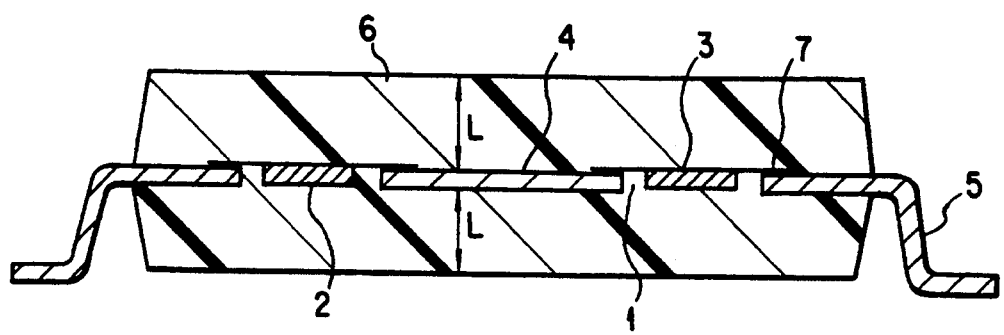
FIG. 1 is a sectional view showing the overall schematic arrangement of a conventional TAB type semiconductor device.
Figure 2:
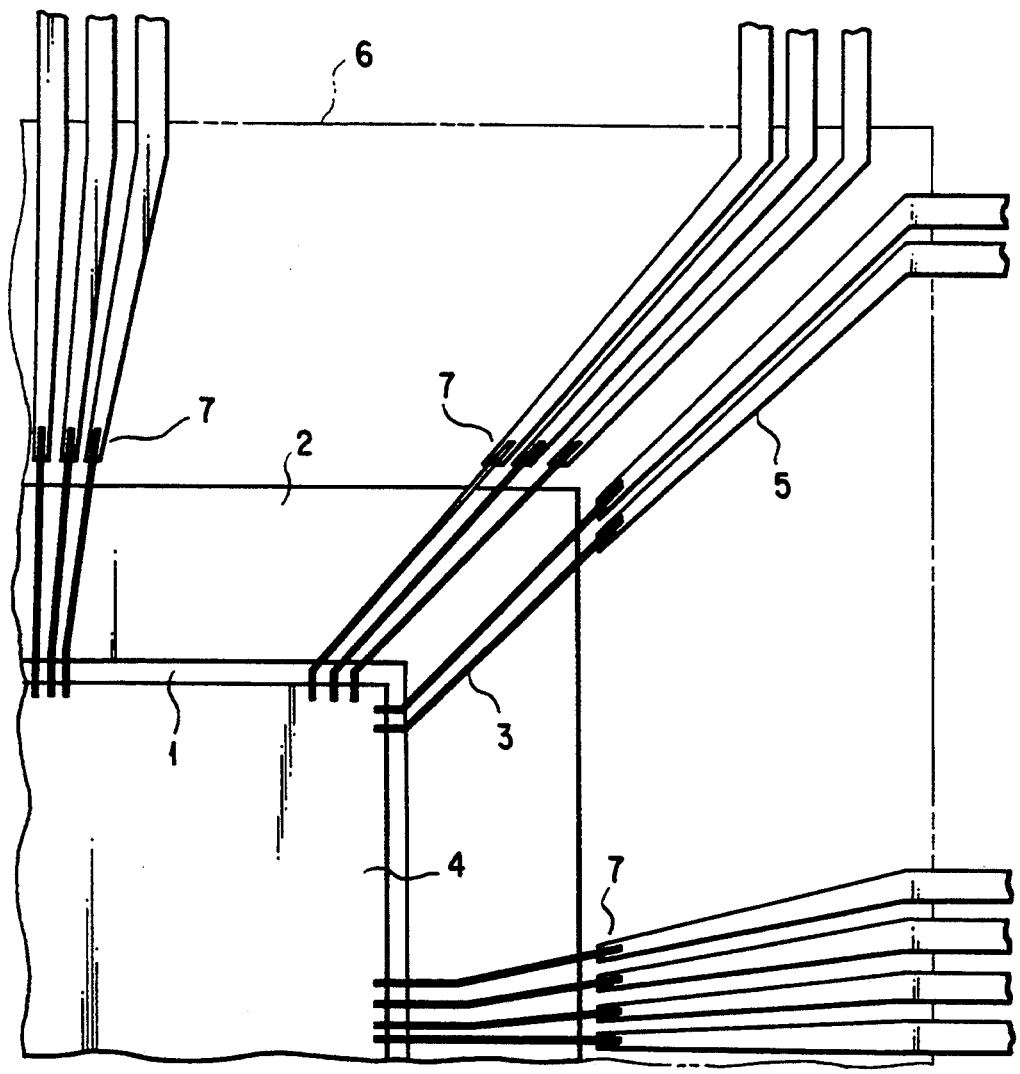
FIG. 2 is an enlarged plan view showing a main part of the semiconductor device in FIG. 1.
Figure 3:
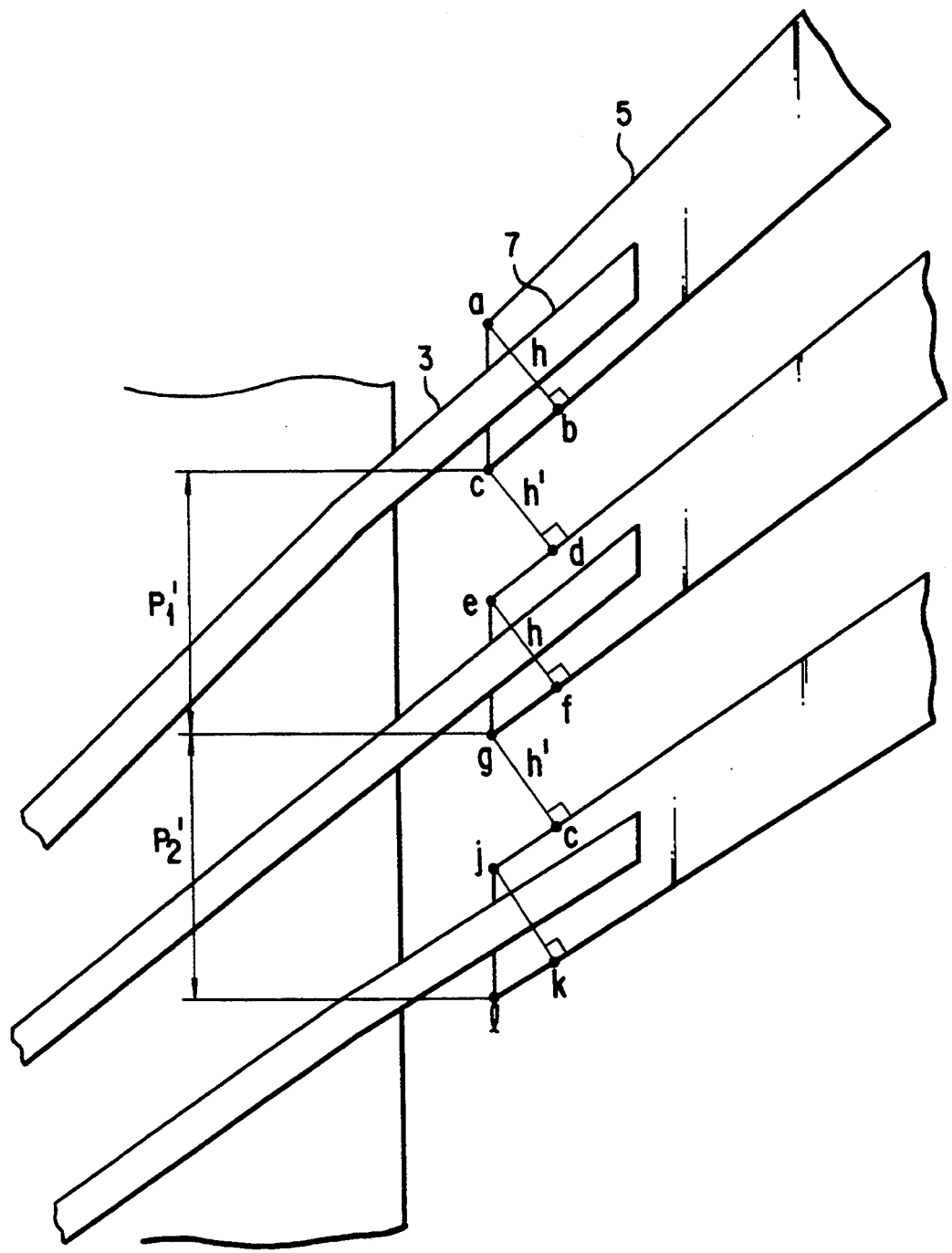
FIG. 3 is an enlarged plan view showing a main part of the part of FIG. 2.
Figure 6:
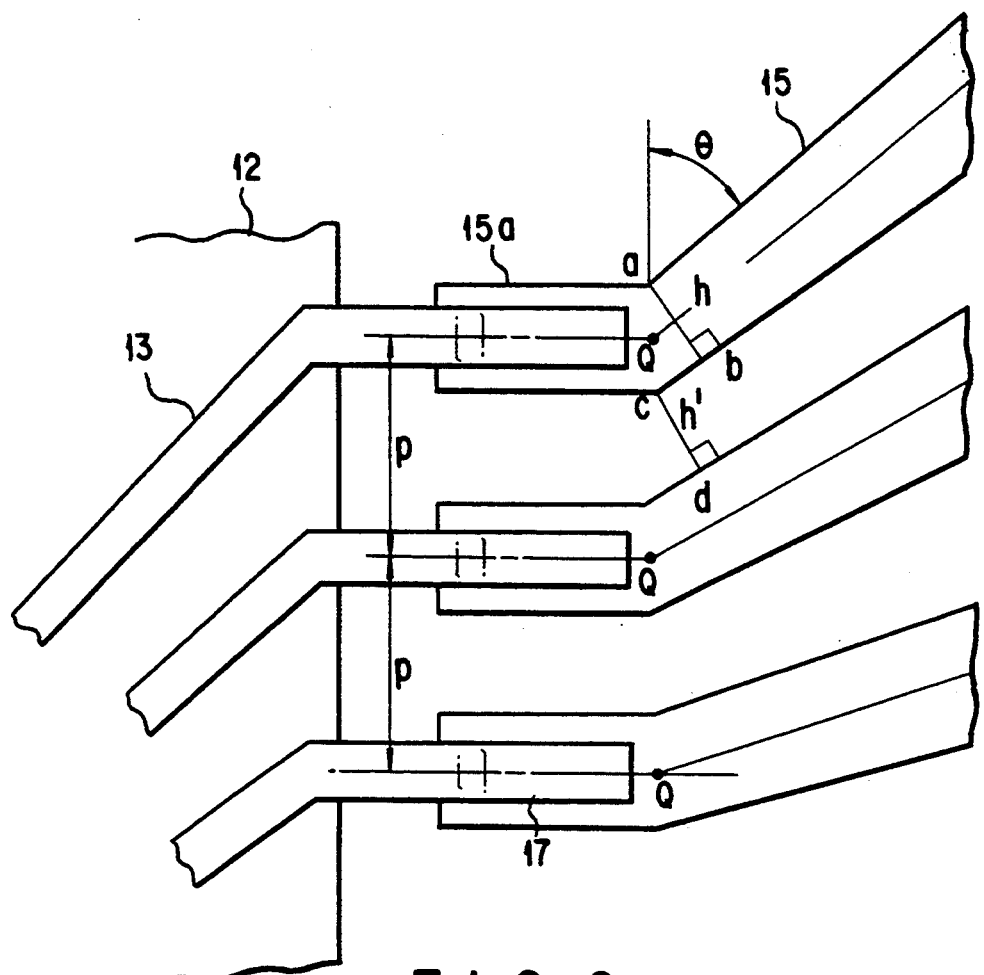
FIG. 6 is an enlarged plan view showing a main part of the part of FIG. 5.
Figure 7:
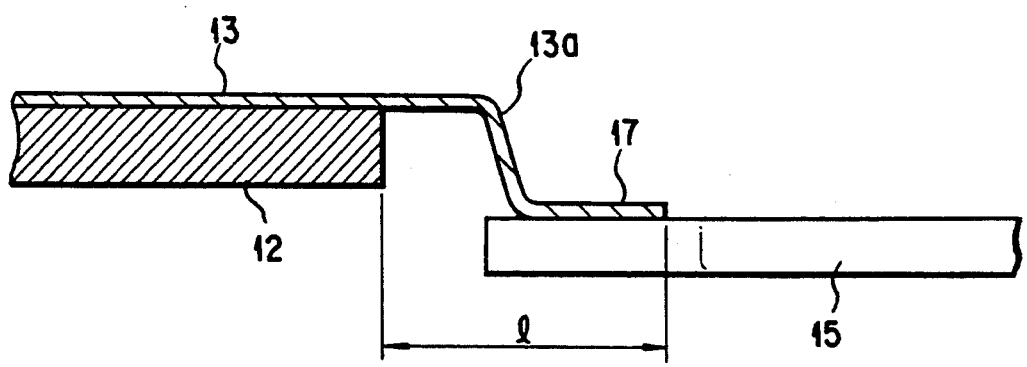
FIG. 7 is a side view including a section in FIG. 6.

A semiconductor device according to the present invention is arranged as shown in FIGS. 4 to 7. FIG. 4 is a sectional view showing the schematic overall arrangement of the semiconductor device, FIG. 5 is an enlarged plan view showing a ¼ part of the semiconductor device in FIG. 4, FIG. 6 is an enlarged plan view showing a main part of the part of FIG. 5, and FIG. 7 is a side view including a section in FIG. 6.

As shown in FIG. 4, the semiconductor device of the present invention is constituted by a TAB tape 12 having through hole 11 for an element and consisting of an insulator, a plurality of leads 13 consisting of a metal foil integrally formed on the TAB tape 12, a semiconductor element 14 connected to one end of each of the leads 13 through a bump (not shown) formed in the through hole 11 for the element, a plurality of lead frames 15 each connected to the other end of a corresponding one of the leads 13, and a mold resin 16 sealed so as to cover most of the TAB tape 12, the leads 13, the semiconductor element 14, and the lead frames 15.

In this case, connection portions 17 between the leads 13 and the lead frames 15 are linearly arranged at equal pitches perpendicularly to the outer periphery of the semiconductor element 14 opposite to the connection portions 17. This is the characteristic feature of the present invention. Each of portions 13a near positions where the leads 13 are respectively connected to the lead frames 15, as is apparent from FIGS. 4 and 7, is formed in a gull-wing shape. Straight end portions 15a of the lead frames 15 extend from ends of the lead frames 15 to flexing points Q of the lead frames 15, and the lengths of the straight end portions 15a are at least 0.3 mm or more. As is apparent from FIG. 4, in the mold resin 16, a resin 16a positioned at the upper portion of the semiconductor element 14 has a thickness $L_1$ set to be smaller than a thickness $L_2$ of a resin 16b positioned at the lower portion of the semiconductor element 14. That is, the mold resin 16 is sealed to satisfy a condition of $L_1 < L_2$.

The above arrangement will be described below in detail. Each of the pitches of the lead frames 15 and the leads 13 is set to be a pitch P, and the lead width h and a lead interval h' at each of four corners in FIG. 6 are selected depending on processing methods. That is, when P=0.32 is satisfied in etching processing, and P=0.38 is satisfied in press processing, it can be assured that the lead width and the sum of the lead width and lead interval (h+h' at the central portion) of the connection portion 17 near the central portion of the semiconductor device are set to be 0.227 and 0.27, respectively. In this case, $\theta < 45°$ is satisfied. The values of the pitch P are obtained when the angle $\theta$ is about 45°. The pitch P can be decreased when the angle $\theta$ is small. The intervals between the semiconductor device and the flexing points Q of lead frames 15 increase as the intervals between the flexing points Q and the center of the semiconductor device decrease, and thereby increasing the lengths of the straight end portions 15a of the lead frames 15a. In this case, the pitch P can be slightly decreased. The lengths of the straight end portions 15a must be set at least about 0.3 mm to 0.5 mm for the following reason.

The connection portions 17 are etched at a time or subjected to single-point bonding such that the flat portions of the gull-wing-shaped leads 13 respectively overlap the straight end portions 15a of the lead frames 15.

The leads 13 are formed in a gull-wing shape because the resin thicknesses of the mold resin 16 satisfy the condition of $L_1 < L_2$ to prevent passivation cracks in the semiconductor element 14. Note that the resin thicknesses of the mold resin 16 satisfy the condition of $L_1 < L_2$ because a stress acts on the semiconductor element 14 due to molding shrinkage. When the thicknesses satisfy the condition of $L_1 < L_2$ to decrease the thickness $L_1$, a stress acting on the semiconductor element 14 can be decreased. For this reason, passivation cracks can be prevented. In an example in which a KE-250MT (a trade name of a mold resin manufacturer) was used and 208 pins are arranged, the number of passivation cracks could be set to be "0".

In manufacturing the above semiconductor device, the leads 13 of the TAB tape 12 are adhered to the semiconductor element 14 first. A bump consisting of Au is generally formed on the semiconductor element 14, and one end of each of the leads 13 is Sn-plated. These ends are heated by a bonding jig to form an Au—Sn alloy, thereby connecting the leads 13 to the semiconductor element 14. The other end of each of the leads 13 is formed in a gull-wing shape by a mold, and then cut to have a desired length. The other end of each of the leads 13 overlaps a corresponding one of the lead frames 15, and the positions of the leads 13 are respectively matched with the positions of the lead frame 15 such that the other end of the lead 13 overlap one end of the corresponding lead frame 15. One end of each of the lead frames 15 is Ag-plated, and the other end of each of the leads 13 is Sn-plated. For this reason, when a bonding jig of about 500° C.×1" is pressed on the leads 13 and the lead frames 15, Ag—Sn diffusion progresses to connect the leads 13 to the lead frames 15, respectively. When the resultant structure in this state is arranged in a transfer mold and subjected to transfer molding, the semiconductor device shown in FIG. 4 is completed.

According to the present invention, the following excellent effect can be obtained. The size of the gull-wing shape of the leads 13 of the TAB tape 12 can easily be assured. That is, when each lead pitch shift and each lead length (indicated by l in FIG. 7) in the semiconductor device of the present invention are compared with those in the semiconductor device of the prior art, the following results can be obtained.

|  | Prior Art | Present Invention |
| --- | --- | --- |
| Lead Pitch Shift | 20 to 30 μm | 15 μm |
| *Lead Length | 5 to 10 μm | 5 μm |

*indicated by l in FIG. 7

Design, size measurement, and size management can easily be performed because the pitches of the lead frames 15 are equal to each other, and because the pitches of the leads of the TAB tape 12 on the lead frame side are equal to each other. In addition, cost required for manufacturing a mold and an etching pattern to be processed can be reduced by 15%. The size of the gull-wing shape of each of the leads 13 of the TAB tape 12 is set to be a desired size, thereby preventing passivation cracks occurring due to a stress of the mold resin 16.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising: a TAB tape having an element through hole; a plurality of leads integrally formed on said TAB tape, straight end portions of said leads being arranged in parallel; a semiconductor element connected to one end of each of said leads through a bump formed in said element through hole; a plurality of lead frames each connected to the other end of a corresponding one of said leads, straight end portions of said lead frames, which extend from ends of said lead frames being arranged in parallel, and the lengths of said straight end portions of said lead frames being at least 0.3 mm or more; and a mold resin sealed to cover most of the area of said TAB tape, said leads, said semiconductor element, and said lead frames, wherein connection portions between said leads and said lead frames are linearly formed at equal pitches perpendicularly to an outer periphery of said semiconductor element opposite to said connection portions.

* * * * *

UNITED STATES PATENT AND TRADEMARK OFFICE
CERTIFICATE OF CORRECTION

PATENT NO. : 5,371,406
DATED : December 6, 1994
INVENTOR(S) : Shinjiro KOJIMA, et al.

It is certified that error appears in the above-indentified patent and that said Letters Patent is hereby corrected as shown below:

On the title page, Item [54] and column 1, line 2, the title is listed incorrectly. It should read:

--STRUCTURE FOR CONNECTING LEADS AND LEAD FRAMES IN A SEMICONDUCTOR DEVICE--

Signed and Sealed this

Twenty-fifth Day of April, 1995

*Attest:*

BRUCE LEHMAN

*Attesting Officer*  *Commissioner of Patents and Trademarks*